United States Patent [19]

English

[11] 3,980,911
[45] Sept. 14, 1976

[54] SUPPORT STRUCTURE AND HOUSING FOR PIEZOELECTRIC CRYSTAL
[75] Inventor: Jack A. English, Elkhart, Ind.
[73] Assignee: CTS Corporation, Elkhart, Ind.
[22] Filed: Feb. 11, 1974
[21] Appl. No.: 441,463

[52] U.S. Cl. ................................ 310/9.4; 310/8.9
[51] Int. Cl.² ........................................ H01L 41/04
[58] Field of Search ................ 310/9.1, 9.4, 9.2, 9.3

[56] References Cited
UNITED STATES PATENTS

| | | | |
|---|---|---|---|
| 2,383,262 | 8/1945 | Kuenstler | 310/9.4 X |
| 2,409,838 | 10/1946 | Cress | 310/9.4 |
| 2,457,145 | 12/1948 | Gray | 310/9.4 |
| 2,464,046 | 3/1949 | Kuenstler | 310/9.4 |
| 3,069,572 | 12/1962 | Dick et al. | 310/9.4 X |
| 3,333,122 | 7/1967 | Christian | 310/9.4 X |
| 3,622,816 | 11/1971 | McGrew | 310/9.4 |
| 3,679,919 | 7/1972 | Ichinose et al. | 310/9.4 |
| 3,746,898 | 7/1973 | Austin | 310/9.4 |

FOREIGN PATENTS OR APPLICATIONS

| | | | |
|---|---|---|---|
| 924,740 | 3/1947 | France | 310/9.4 |
| 524,167 | 7/1940 | United Kingdom | 310/9.4 |
| 596,503 | 1/1948 | United Kingdom | 310/9.4 |

Primary Examiner—Mark O. Budd

[57] ABSTRACT

An improved piezoelectric crystal unit provides a housing, a piezoelectric crystal element, and oppositely disposed mounting means for suspending the crystal element within the housing. A first set of three cradle means and a second set of three cradle means engage opposite faces of the crystal element. Each of the first set of cradle means contains a face member disposed adjacent the first face of the crystal element and an edge member disposed adjacent the peripheral edge of the crystal element and each of the second set of three cradle means contains a face member disposed adjacent the second face of the crystal element and an edge member disposed adjacent the peripheral edge of the crystal element. Integral with each of the first set of cradle means are elongated resilient legs exerting uniform pressures on one face of the crystal element and integral with each of the second set of cradle means are elongated resilient legs exerting uniform counterbalancing pressures on the other face of crystal element. The housing provides a nest and contains a rim having a pair of notches and an end wall having an embossed center portion. A cover having an end wall with an embossed center portion interfits with the housing to enclose the nest. A first circular center section engages the embossed center portion of the housing and a first terminal means integral with the circular center section extends through a first one of the notches to align the first set of three cradle means within the nest. A second circular center section engages the embossed center portion of the cover and a second terminal means integral with the second circular center section extends through a second one of the notches to align the second set of three cradle means within the nest.

9 Claims, 4 Drawing Figures

SUPPORT STRUCTURE AND HOUSING FOR PIEZOELECTRIC CRYSTAL

This invention relates to piezoelectric crystal units, and, more particularly, to an improved construction of such units and to an improved piezoelectric crystal element support within such units.

A major concern in dealing with piezoelectric crystal element quality is the mechanical strains produced on the crystal element by the crystal element support means causing an alteration in the piezoelectric characteristics of the crystal element. These mechanical strains on the crystal element can result from shocks and other disturbances to the crystal element support means such as aging or temperature changes. A given shock or disturbance to the crystal element support means will have an undesirable effect upon the crystal element, particularly if the crystal element is rigidly held by or securely attached to the crystal element support means or the crystal element support means produces unbalanced pressures on the crystal element. Mechanical strains on the crystal element are also caused by the crystal element moving into contact with other components of the crystal assembly. The piezoelectric crystal unit shown in U.S. Pat. No. 3,662,816 avoids mechanical strain caused by the crystal element being securely attached to the support means by providing a pair of opposed end caps mounted on a center frame with the crystal element held between the end caps and encircled by the center frame. Each of the end caps contains a series of eight tabs stamped or lanced therefrom to engage the crystal element. However, the variance in the tabs and the spacing of the end caps to permit each of the tabs to contact the crystal element results in a relatively rigid and uneven engagement of the crystal element by the tabs and end caps. On the other hand, if a shock or disturbance to the crystal unit in the above-mentioned patent is sufficient to overcome the force holding the crystal element between the tabs of the end caps, then the crystal element is free to slide into engagement with the frame encircling the crystal element. It would therefore be desirable to provide a new and improved crystal element support means that flexibly supports the crystal element under uniform pressure and is not securely attached to the crystal element even though preventing movement of the crystal element into contact with other components of the crystal unit.

Another source of mechanical strains on the piezoelectric crystal element is the initial strain produced on the crystal element by the crystal element support means during the assembly of the crystal unit. These initial mechanical strains can often change the piezoelectric characteristics of the crystal element sufficiently enough to require time consuming and costly frequency adjustments to the crystal element before final assembly. The reason for the need for frequency adjustments is the unpredictability and nonuniformity of the initial mechanical strains exerted on the crystal element by the crystal element support means. It would therefore be desirable to provide an improved piezoelectric crystal element support means that eliminates time consuming and costly frequency adjustments to the crystal element by exerting consistent and uniform pressure on the crystal element during assembly of the crystal unit.

The economical production of piezoelectric crystal units necessitates a minimum number of component parts that are economical and easy to align and assemble. In high volume production, it is time consuming and costly to change the relative orientation of any of the component parts during assembly, for example, to complete the assembly or to assemble and align successive component parts. It would therefore be desirable to reduce the number of parts used in a piezoelectric crystal unit as well as to use simple and economical parts permitting the successive stacking of component parts one on top of another in proper alignment to complete the assembly.

Accordingly, it is an object of the present invention to provide a new and improved piezoelectric crystal unit. Another object of the present invention is to provide a new and improved piezoelectric crystal element support means for flexibly suspending the crystal element under uniform pressure.

Still another object of the present invention is to provide a new and improved crystal element support means within a housing wherein the crystal element is not securely attached to the support means yet restrained by the support means from movement into contact with the housing.

Another object of the present invention is to provide a new and improved crystal element support means wherein a first plurality of cradle means are disposed adjacent a first face and the peripheral edge of the crystal element and a second plurality of cradle means are disposed adjacent a second face and the peripheral edge of the crystal element.

Another object of the present invention is to provide a new and improved crystal element support means wherein each of a plurality of cradle means contains a face member and an edge member inclined with respect to the face member, each of the face members being alternately disposed adjacent one of the faces of the crystal element and each of the edge members being disposed adjacent the peripheral edge of the crystal element.

Another object of the present invention is to provide a new and improved crystal element support means by providing a three point contact with each of the faces of the crystal element.

Still another object of the present invention is to provide a first set of three resilient legs adjacent one face of the crystal element, the first set of resilient legs providing uniform pressures on the crystal element and a second set of three resilient legs adjacent the other face of the crystal element, the second set of resilient legs providing uniform counterbalancing pressures on the crystal element.

Another object of the present invention is to provide a new and improved piezoelectric crystal unit wherein a housing provides a nest and a plurality of notches for the successive stacking and positioning of a first crystal support and terminal means, a piezoelectric crystal element, and a second crystal support and terminal means within the nest.

A still further object of the present invention is to provide a new and improved piezoelectric crystal unit having a housing with a pair of end walls wherein each of the end walls contains an embossed portion and each pair of oppositely disposed crystal element support means contains a centering ring, each of the centering rings interfitting with a respective one of the embossed portions to align the crystal element support means within the housing.

The present invention is concerned with a piezoelectric crystal unit having a housing and oppositely disposed mounting means for suspending the crystal element within the housing. The oppositely disposed mounting means comprise a first set of three cradle means having face members disposed adjacent one face of the crystal element and integral edge members inclined with respect to the face members and disposed adjacent the peripheral edge of the crystal element and a second set of three cradle means having face members disposed adjacent the other face of the crystal element and integral edge members inclined with respect to the face members and disposed adjacent the peripheral edge of the crystal element. Integral with each of the first set of cradle means is an elongated resilient leg connected to a first circular center section and integral with each of the second set of cradle means in an elongated resilient leg connected to a second circular center section. The resilient legs connected to the first center section exert uniform pressures on one face of the crystal element and the resilient legs connected to the second center section exert uniform counterbalancing pressures on the other face of crystal element, the crystal element being free to tilt or shift to maintain the uniform pressures of the resilient legs on the crystal element. The housing contains a base section defining a nest and provided with a rim having a pair of notches and an end wall having an embossed center portion. A cover section having an end wall with an embossed center portion interfits with the housing section to enclose the nest. The first circular center section is integral with a first terminal means and engages the embossed center portion of the housing section, the first terminal means extending through a first one of the notches to align the first set of three cradle means within the nest. The second circular center section is integral with a second terminal means and engages the embossed center portion of the cover section, the second terminal means extending through a second one of the notches to align the second set of three cradle means within the nest.

For a better understanding of the present invention, reference may be had to the accompanying drawings wherein the same reference numerals have been applied to like parts and wherein.

Figure 1:
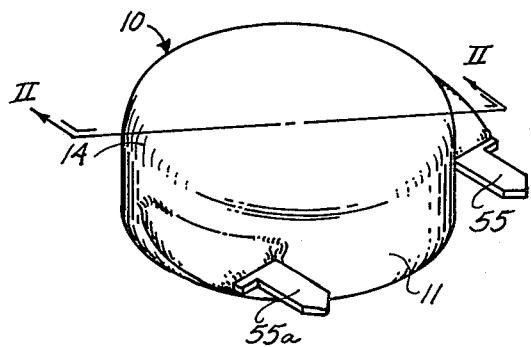
FIG. 1 is an isometric view of a piezoelectric crystal unit built in accord with the present invention.

Referring now to the drawings, a piezoelectric crystal unit is generally indicated at 10 comprising a housing 11, a crystal element 12, a pair of oppositely disposed terminal and crystal support means 13 and 13a and a protective layer 14 covering the housing 11.

Considering first the housing 11, it comprises a cup-shaped base section 16 defining a nest or cavity 17 and a cap or cover section 19 interfitting with the base section 16 to enclose the nest 17, the base and cover sections, preferably being molded of any suitable nonconductive material. The base section 16 of the housing 11 includes an end wall 21, and annular rim 23 integral with the end wall 21 and providing a pair of notches 25 and 25a, and an embossed portion 27 integral with and disposed in the center of the end wall 21. The rim 23 contains an annular ledge 29 and an inner peripheral wall 31 communicating with the nest 17. The cover section 19 of the housing comprises an end wall 35, an embossed portion 37 integral with the end wall 35 and disposed in the center of the end wall, and an annular flange 39 integral with the end wall, the flange 39 containing a peripheral edge 41. Upon interfitting the cover section 19 to the base section 16 the peripheral edge 41 of the flange 39 abuts the annular ledge 29 of the rim 23. The completed piezoelectric unit is protected by a layer 14 of any suitable potting material covering the housing 11.

The piezoelectric crystal element 12 comprises a pair of opposed faces 43 and 43a bounded by a peripheral edge 44 and is conventionally formed or cut from quartz or other piezoelectric material. The face 43a of the crystal element 12 is provided with a conductive termination or electrode 45a containing a circular center section 47a disposed in the center of the piezoelectric element and a fantail portion 49a extending from the center section 47a to near the peripheral edge 44 of the crystal element 12. The fantail portion 49a of the electrode subtends an angle greater than 120° on the circumference of the crystal element 12. A similar electrode is provided on the face 43 of the crystal element having a circular center section and a fantail portion also subtending an angle greater than 120°. The electrodes are composed of any suitable electrically conductive electrode material such as gold, silver and various alloys and are affixed in thin layers to one of the corresponding faces 43 and 43a of the crystal element 12 by any of various conventional techniques such as plating or sputtering.

The terminal and crystal support means 13 and 13a cradle the piezoelectric crystal element 12 in suspension within the nest 17 of the housing 11 and provide for electrical contact from the electrodes to an external circuit. Each of the terminal and crystal support means 13 and 13a is a one-piece metal stamping preferably of spring tempered brass formed to provide a crystal support means, a terminal, a crystal positioner, and an electrical contact with an electrode. Preferably, each of the terminal and crystal support means 13 and 13a comprises a circular center section 51 and 51a with an aperture, three elongated resilient legs 52 and 52a integral with the center section, cradle means 53 and 53a integral with the resilient legs 52 and 52a, and terminal means 55 and 55a integral with the center section 52 and 52a and extending through the housing 11. Terminal means 55 extends through notch 25 in the rim 23 and terminal means 55a extends through notch 25a in rim 23 of base section 16.

Figure 2:
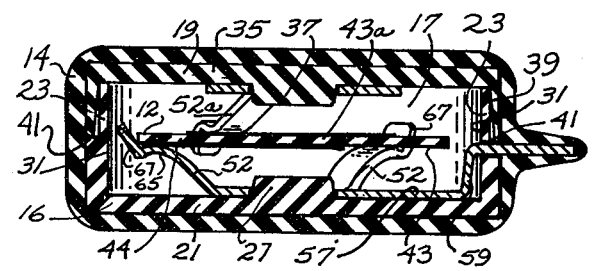
FIG. 2 is a sectional view taken along line II—II of FIG. 1.
Figure 3:
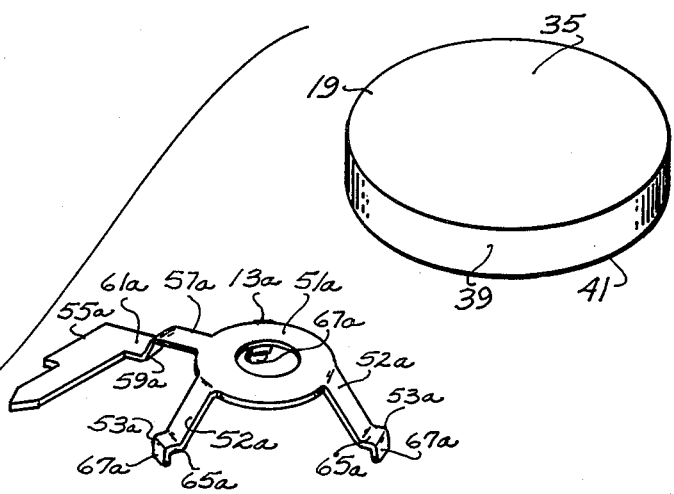
FIG. 3 is an exploded view of the crystal unit shown in FIG. 1.
Figure 3:
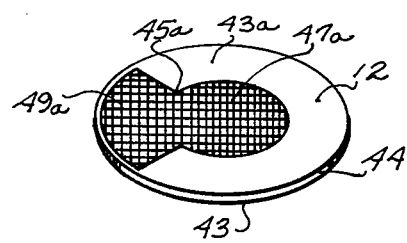
Figure 4:
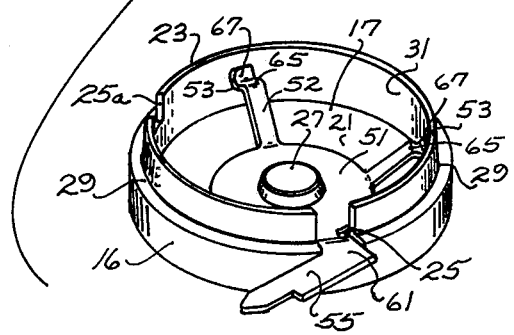
FIG. 4 is an isometric view illustrating in detail the support of the crystal element.
Figure 4:
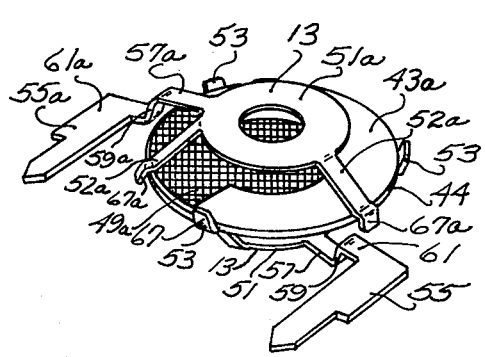

With reference to terminal and crystal support means 13, the terminal means 55 contains a first section 57, a second section 59, and a third section 61 as best seen in FIGS. 2 and 4, the first section 57 extending radially outwardly from the circular center section 51 and being positioned along the end wall 21 of the base section 16. The center section 51 disposed along the end wall 21 of the base section 16 encircles the embossed portion 27 in the center of the end wall 21. The second section 59 of the terminal portion 55 extends perpendicular to the first section 57 along the inner periphery of the rim 23 and the third section 61 extends perpendicular to the second section 59 through the notch 25 providing a first terminal to an external circuit.

The terminal means 55a of the terminal and support means 13a are in allochiral relationship to the terminal means 55 of the terminal and support means 13 and contains a first section 57a extending from the center section 51a and disposed along the end wall 35. The circular center section 51a disposed along the end wall 35 encircles the embossed portion 37 in the center of the end wall 35. The second section 59a of the terminal means 55a extends perpendicular to the first section 57a along the inner periphery of the rim 23 and the third section 61a extends perpendicular to the second section 59a through the notch 25a providing a second terminal to an external circuit. The relationship of the terminal means 55 and 55a with respect to the legs 52 and 52a is fixed and the positioning of the terminal means 55 and 55a within the notches 25 and 25a determines the relative disposition of the legs 52 and 52a with respect to each other within the nest 17, the legs 52 and 52a being centered within the nest 17 by the engagement of the circular center sections 51 and 51a with the embossed portions 27 and 37 respectively.

With respect to the terminal and support means 13, the three resilient legs 52 extend from the outer periphery of the center section 51 to the interior of the nest 17. The three legs ae equally spaced around the periphery of the center section 51 at 120° intervals defining a conically shaped pattern and providing a three point support of the crystal element 12. Each of the cradle means 53 contains a face support 65 integral with the resilient leg 52 and an edge support 67 inclined with respect to the face support 65 and integral therewith, each of the cradle means 53 being suspended within the cavity 17. Each of the face supports 65 resiliently engages the face 43 of the crystal element 12 and each of the edge supports 67 is disposed adjacent the peripheral edge 44 of the crystal element 12 and resiliently engageable therewith for restricting lateral movement of the element 12. In a similar manner the three resilient legs 52a extend from the center section 51a to the interior of the nest 17. The legs 52a are equally space around the periphery of the center section 51a at 120° intervals defining a conically shaped pattern and also providing a three point support of the crystal element 12. Each of the cradle means 53a contains a face support 65a integral with the resilient leg 52a and an edge support 67a inclined with respect to the face support 65a and integral therewith each of the cradle means 53 being suspended within the cavity 17. Each of the face supports 65a resiliently engages the face 43a of the crystal element 12 and each of the edge supports 67a is disposed adjacent the peripheral edge 44 of the element 12 and resiliently engageable therewith for restricting lateral movement of the element 12. It is to be understood that lateral movement of the element 12 means movement of the element 12 in a plane substantially parallel to the end walls 21 and 35.

The crystal element 12 is suspended within the interior of the nest 17 by the cradle means 53 and 53a and the spring tension of the oppositely disposed elongated resilient legs 52 and 52a. The elongated resilient legs 52 and 52a provide flexibility for cushioning the crystal element 12 from shocks and the freedom of the crystal element 12 and each of the terminal and support means 13 and 13a to shift and move within the nest 17 minimizes the effects of shocks and other disturbances such as aging and temperature change on the crystal element. The tolerance required for the interfitting of the circular center sections 51 and 51a with the embossed portions 27 and 37 permits the shifting and movement of the circular sections 51 and 51a along the embossed portions 27 and 37. None of the face supports 65 and 65a or edge supports 67 and 67a of the cradle means 53 and 53a are securely attached to the crystal element 12, the crystal element 12 being free to shift and move along the face supports 65 and 65a. Preferably, a sufficient number of the edge supports 67 and 67a do not make contact with the peripheral edge 44 of the crystal element 12, permitting radial movement of the crystal element on the face supports 65 and 65a and relieving the crystal element 12 from a compressive force along the peripheral edge 44.

The face supports 65 and 65a and the resilient legs 52 and 52a suspend the crystal element away from contact with the end walls 21 and 35. The edge supports 67 and 67a, although permitting radial movement, restrain the crystal element from sliding radially within the nest 17 into contact with the inner periphery of the rim 23. The face supports 65 are spaced at 120° intervals along the face 43 of the crystal element and the face supports 65a are spaced at intervals of 120° along the face 43a of the crystal element ensuring that one of the face supports 65 and 65a will be in electrical contact with the fantail portions of the electrodes on the faces 43 and 43a of the crystal element 12. The three point suspension of the crystal element by the uniformly spaced resilient legs 52 with integral cradle means 53 provides equal pressure by each of the resilient legs 52 on the face 43 of the crystal element and the three point suspension of the crystal element by the uniformly spaced resilient legs 52a with integral cradle means 53a provides equal counterbalancing pressures by each of the three resilient legs 52a on the face 43a of crystal element 12. The crystal element 12 is free to tilt and shift within the nest 17 to counterbalance the pressures exerted on the crystal element by each of the opposed resilient legs 52 and 52a and to maintain an equal pressure by each of the resilient legs 52 and 52a upon the crystal element 12. As seen in FIG. 4, preferably, the cradle means 53 and 53a contact the crystal element 12 at staggered locations around the periphery of the crystal element. Each of the cradle means 53 contacts the crystal element at a point intermediate the contact of two of the cradle means 53a and each of the cradle means 53a contacts the crystal element at a point intermediate the contact of two of the cradle means 53.

From the above description, it is apparent that the piezoelectric crystal unit can be rapidly assembled in production. For example, the base section 16 of the housing 11 provides a nest 17 for the assembly of the crystal element 12 and the terminal and support means 13 and 13a. The terminal and support means 13 is assembled to the base section 16 by interfitting the circular center section 51 about the embossed portion 27 on the end wall 21 and positioning the terminal means 55 through the notch 25 in the rim 23. The crystal element is placed on the cradle means 53 of the terminal and support means 13 and the terminal means 55a is then positioned through the notch 25a in the rim 23 with the cradle means 53a of the terminal and support means 13a contacting the crystal element 12. The cap section 19 of the housing 11 is then interfit with the base section 16 of the housing, the embossed portion 37 of the end wall 35 extending through the circular center section 51a of the terminal and support means 13a.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. In a piezoelectric crystal unit, the combination of a housing containing a plurality of walls, including a pair of opposed walls, defining a cavity, an embossed portion integral with each of the opposed walls and centered thereon, a piezoelectric crystal element containing a pair of opposed faces and a peripheral edge connecting the faces, an electrode deposited on each of the faces of the crystal element, each of the electrodes having a circular center section and a fantail portion extending from the circular center section toward the peripheral edge of the crystal element, a first and a second terminal means extending outwardly from the housing, each of the terminal means having a leg, a first set of three cradle means and a second set of three cradle means suspending the crystal element within the cavity of the housing, each of the first set of three cradle means being disposed adjacent the peripheral edge and one face of the crystal element at spaced intervals and each of the second set of three cradle means being disposed adjacent the peripheral edge and the other face of the crystal element at spaced intervals, the cradle means of the first and second sets being disposed in staggered relationship, each of the cradle means comprising restraining means limiting movement of the crystal element within the cavity, a first circular alignment member connected to the leg of the first terminal means, a second circular alignment member connected to the leg of the second terminal means, the legs extending outwardly from the circular alignment members, a resilient leg connected to each of said first set of three cradle means and to the first circular alignment member, and a resilient leg connected to each of said second set of three cradle means and to the second circular alignment member, the resilient legs being equally spaced around the circumference of the circular alignment members and extending outwardly therefrom, each of the circular alignment members being disposed around one of the embossed portions of the opposed walls, the fantail portion of the electrode on said one face of the crystal element making electrical contact with one of said first set of three cradle means and the fantail portion of the electrode on said other face of the crystal element making electrical contact with one of said second set of three cradle means.

2. The piezoelectric crystal unit of claim 1 wherein each of the first plurality of cradle means comprises a face member and an edge member inclined with respect to the face member, the face members being disposed adjacent said one face of the crystal element and the edge members being disposed adjacent the peripheral edge of the crystal element and wherein each of the second plurality of cradle means comprises a face member and an edge member inclined with respect to the face member, the face members being disposed adjacent said other face of the crystal element and the edge members being disposed adjacent the peripheral edge of the crystal element.

3. In a piezoelectric crystal unit, the combination of a housing containing a plurality of walls defining a cavity, a piezoelectric crystal element containing a first and a second face and a peripheral edge connecting said faces, the crystal element being disposed within the cavity of the housing, an electrode deposited on each of the first and second faces of the crystal element, a first and a second terminal means extending outwardly from the housing, and oppositely disposed first and second crystal support means, the first support means connected to the first terminal means and the second support means connected to the second terminal means, each of the crystal support means containing a center section connected to the terminal means, a plurality of cradle means suspending the crystal element within the cavity, and an elongated resilient leg interconnecting each cradle means and the center section, the cradle means of the first crystal support means being disposed adjacent the first face and the peripheral edge of the crystal element and the cradle means of the second support means being disposed adjacent the second face and the peripheral edge of the crystal element, the electrode on the first face of the crystal element making electrical contact with one of the cradle means of the first support means and the electrode on the second face of the crystal element making electrical contact with one of the cradle means of the second support means.

4. The piezoelectric crystal unit of claim 3 wherein each of the cradle means comprises a face support and a peripheral edge support integral with the face support, the peripheral edge support of each of the cradle means being disposed adjacent the peripheral edge of the crystal element and the face support of each of the cradle means of the first crystal support means being disposed adjacent the first face of the crystal element and the face support of each of the cradle means of the second crystal support means being disposed adjacent the second face of the crystal element.

5. In a piezoelectric unit, the combination of a housing containing first and second end walls, a third wall connecting the first and second end walls, said walls defining a cavity, a crystal element containing a first surface and a second surface spaced apart from the first surface, the crystal element being disposed within the cavity of the housing, a conductive termination deposited on each of the surfaces of the crystal element, a first and a second terminal means extending outwardly from the housing, a first alignment member connected to the first terminal means and disposed adjacent the first end wall, a first plurality of elongated resilient legs connected to the first alignment member and to the first surface of the crystal element, each of the first plurality of resilient legs exerting equal pressure on the first surface of the crystal element, at least one of said resilient legs being connected to the conductive termination deposited on the first surface of the crystal element, a second alignment member connected to the second terminal means and disposed adjacent the second end wall, a second plurality of elongated resilient legs connected to the second alignment and to the second surface of the crystal element, at least one of said resilient legs being connected to the conductive termination deposited on the second surface of the crystal element, each of the second plurality of resilient legs exerting equal pressure on the second surface of the crystal element counterbalancing the pressure of each of said first plurality of resilient legs.

6. A piezoelectric crystal unit comprising a housing containing a plurality of walls defining a cavity, a piezoelectric crystal element having a pair of opposed faces and a periphery, the crystal element being disposed within the cavity of the housing, an electrode engaging each of the faces of the crystal element, a first set and a second set of three cradle means disposed in the housing and supporting the crystal element within the interior of the housing, each of the three cradle means of the first set comprising a face member contacting one of the faces of the crystal element at spaced intervals at the periphery of the crystal element, each of the three cradle means of the second set comprising a face member contacting the other of the faces of the crystal element at spaced intervals near the periphery of the crystal element, restraining means disposed adjacent the periphery of the crystal element for limiting movement of the crystal element within the cavity, said restraining means being connected to at least one of said face members, at least one of the face members of the first set of cradle means being electrically connected to the electrode on said one of the faces of the crystal element, at least one of the face members of the second set of cradle means being electrically connected to the electrode on the other of the faces of the crystal element, a first and a second terminal means extending outwardly from the housing, a first alignment member connected to the first terminal means, an elongated resilient leg connected to the first alignment member and to each of the cradle means of the first set, said resilient legs providing uniform pressures on one of the faces of the crystal element, a second alignment member connected to the second terminal means, an elongated resilient leg connected to the second alignment member and to each of the cradle means of the second set, said resilient legs providing uniform pressures on the other of the faces of the crystal element.

7. In a piezoelectric crystal unit, the combination of a housing provided with a nest and a first and a second notch, a cover secured to the housing to enclose the nest, a crystal element containing a pair of opposed faces, the crystal element being disposed within the nest formed by the housing, a conductive termination deposited on each of the faces of the crystal element, a first crystal element support means connected to one of the faces of the crystal element, a first terminal means communicating with the first notch of the housing and integral with the first support means for positioning the first support means within the nest, a second crystal element support means connected to the other face of the crystal element, and a second terminal means communicating with the second notch of the housing and integral with the second support means for positioning the second support means within the nest, the first support means being in contact with the conductive termination on one of the faces of the crystal element and the second support means being in contact with the conductive termination on the other of the faces of the crystal element, each of the housing and cover comprising an end wall with an integral embossed portion in the center of the end wall, each of the first and second crystal element support means comprising center sections integral with one of the first and second terminal means, the center section of the first support means encircling the embossed portion of the housing and the center section of the second support means encircling the embossed portion of the cover, each of the first and second terminal means comprising a portion integral with one of the center sections of the first and second crystal element support means and extending radially outwardly therefrom.

8. The piezoelectric crystal unit of claim 7 wherein the housing contains an end wall and an alignment portion integral with the end wall and the cover contains and end wall and an alignment portion integral with the end wall and wherein the first crystal element support means contains an alignment member integral with the first terminal means and the second crystal element support means contains an alignment member integral with the second terminal means, the alignment member of the first crystal support means communicating with the alignment portion of the housing and the alignment member of the second crystal support means communicating with the alignment portion of the second housing section aligning the first and second support means within the nest.

9. The piezoelectric crystal unit of claim 8 wherein the housing contains a rim and the first and second positioning means are notches in the rim and wherein the alignment portions are embossed portions on the end walls and the alignment members are rings disposed around the embossed portions.

* * * * *